United States Patent
Huang et al.

(10) Patent No.: US 6,653,203 B1
(45) Date of Patent: Nov. 25, 2003

(54) THIN SIDEWALL MULTI-STEP HDP DEPOSITION METHOD TO ACHIEVE COMPLETELY FILLED HIGH ASPECT RATIO TRENCHES

(75) Inventors: Tsung-Hsun Huang, Taipei (TW); Yeur-Luen Tu, Taichung (TW); Chung Yi Yu, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/154,285

(22) Filed: May 23, 2002

(51) Int. Cl.$^7$ ................................................ H01L 21/76
(52) U.S. Cl. .................. 438/435; 438/221; 438/296; 438/359; 438/424; 438/778
(58) Field of Search ................... 438/761, 763, 438/778, 787, 758, 221, 296, 359, 424, 427, 435, 294, 295, 353, 354

(56) References Cited

U.S. PATENT DOCUMENTS

| | | | |
|---|---|---|---|
| 5,270,264 A | 12/1993 | Andideh et al. | 437/228 |
| 5,913,140 A * | 6/1999 | Roche et al. | 438/624 |
| 5,920,792 A | 7/1999 | Lin | 438/633 |
| 6,030,881 A | 2/2000 | Papasouliotis et al. | 438/424 |
| 6,037,018 A | 3/2000 | Jang et al. | 427/579 |
| 6,048,775 A | 4/2000 | Yao et al. | 438/427 |
| 6,150,238 A | 11/2000 | Wu et al. | 438/435 |
| 6,200,911 B1 | 3/2001 | Narwankar et al. | 438/758 |
| 6,271,143 B1 * | 8/2001 | Mendicino | 438/700 |
| 6,372,602 B1 * | 4/2002 | Mitsuiki | 438/424 |

* cited by examiner

Primary Examiner—Carl Whitehead, Jr.
Assistant Examiner—Thanhha Pham
(74) Attorney, Agent, or Firm—George O. Saile; Stephen B. Ackerman

(57) ABSTRACT

A multi-step HDP deposition and sputtering process for void-free filling of high aspect ratio trenches and for trenches having stepped cross-sectional profiles. The method is particularly applicable to filling trenches formed in triply layered substrates comprising a silicon layer, an oxide layer and a nitride layer, wherein the nitride layer has been pulled back from the edge of the trench opening and forms a step. The method allows the void-free filling of such a trench without damaging the nitride layer in the process. Briefly, the essence of the method is the formation of deposited layers on the sidewalls of the trench wherein the first layer is deposited with a high deposition to sputtering ratio (D/S>10) and low bias power to form a thin layer, with no overhang, that is capable of protecting the nitride layer during subsequent deposition and sputtering steps. A subsequent in-situ sputtering step at a lower D/S ratio using oxygen as the sputtering gas maintains a wide trench opening which then allows the complete filling to proceed using argon as the sputtering gas for increased throughput.

13 Claims, 3 Drawing Sheets

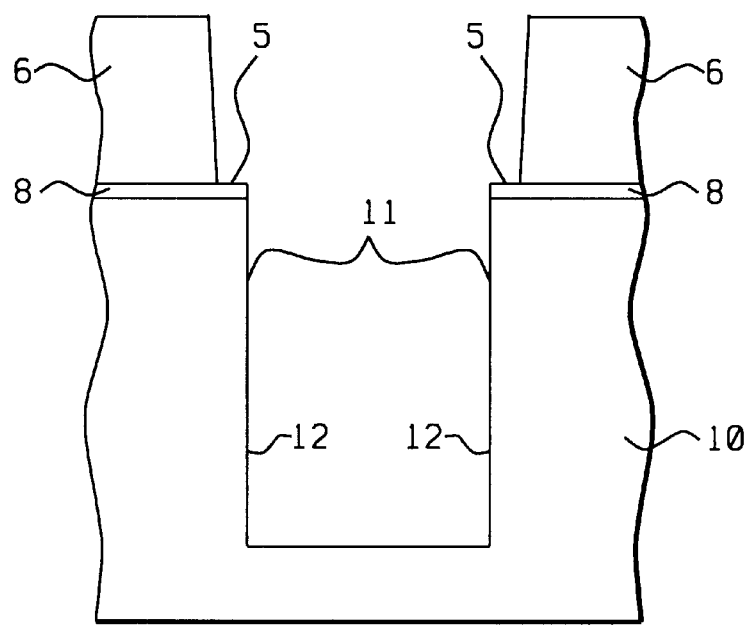
FIG. 1
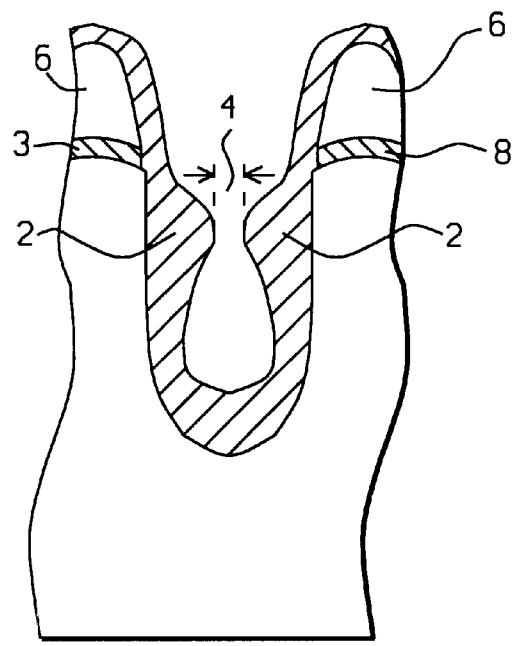
FIG. 2 - Prior Art

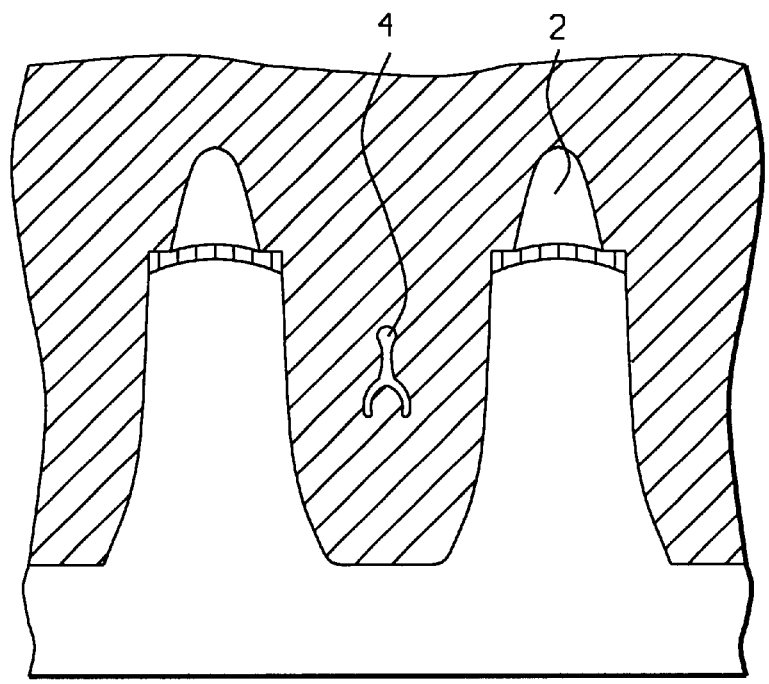
*FIG. 3 — Prior Art*
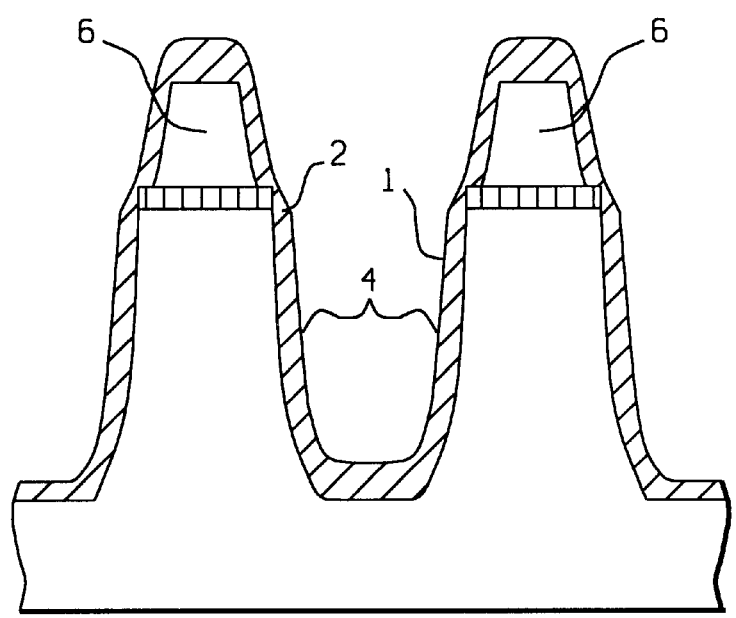
*FIG. 4*

THIN SIDEWALL MULTI-STEP HDP DEPOSITION METHOD TO ACHIEVE COMPLETELY FILLED HIGH ASPECT RATIO TRENCHES

RELATED PATENT APPLICATION

This application is related to Ser. No. 10/225,803, filing date Aug. 22, 2002, assigned to the same assignee as the current invention.

BACKGROUND OF THE INVENTION

1. Field of the Invention

This invention relates generally to the fabrication of integrated circuits and, more specifically, to the use of a novel high-density plasma (HDP) method for filling gaps and trenches in integrated circuit structures which is particularly effective when said gaps and trenches have stepped cross-sectional profiles that would prevent void free and damage free filling by the usual methods.

2. Description of the Related Art

Many processes in the fabrication of integrated circuits require the formation of variously shaped trenches in the substrate and their subsequent filling, using sputtering and plasma enhanced deposition processes. For example, the fabrication of DRAM circuits requires dielectric filled trenches for the formation of storage capacitors. There are also a wide variety of circuit topologies (including DRAM circuits) that require portions of the circuit to be isolated from each other by shallow trenches ("shallow trench isolation" or STI). As circuits progressively shrink in size, the aspect ratio (depth/width) of these trenches become larger as their widths become appreciably smaller than their depths (widths with outside diameters <0.2 microns being common) and a subsequent complete and uniform filling is rendered problematic due to the angular distribution of the sputtered dielectric atomic species in the deposition process. In particular, such atoms tend to follow a line of sight trajectory, causing poor coverage on steeply slanted trench sidewalls. A particularly serious problem that results is the production of fills having internal voids. Compounding the problem of void formation is the fact that the trenches are often formed in multilayered substrates, such as silicon substrates on which there are successive layers of silicon oxides and silicon nitrides. It is not uncommon that the upper nitride layer is pulled back from the edge of the trench by amounts between 100–500 angstroms to reduce gate oxide thinning when the nitride layer is subsequently removed. This nitride pull-back produces a stepped cross-sectional profile in the trench, leading to a shadowing and overhang effect as the dielectric fill material is deposited within the trench. Another cause of voids during the filling process is a re-deposition effect associated with the use of argon as a sputtering gas.

The various problems associated with trench filling and methods of eliminating or reducing them have been noted in the prior art. Jang et al. (U.S. Pat. No. 6,037,018) teaches a method for filling shallow trenches (STI) with a high density plasma chemical vapor deposition (HPDCVD) oxide. The method so taught has a primary objective of protecting the trench sidewalls from the effects of the sputtering process by first depositing an $O_3$-TEOS barrier layer. The method, however, does not specifically address the problem of void formation. Andideh et al. (U.S. Pat. No. 5,270,264) teach a method for filling gaps between metal lines on integrated circuits by means of interlayer dielectric (ILD) deposition using plasma enhanced chemical vapor deposition (PECVD). The method involves three steps, (1) CVD ILD deposition, (2) medium pressure argon sputter etch and (3) CVD ILD deposition. Wu et al. (U.S. Pat. No. 6,150,238) teach a method of filling isolation trenches wherein voids are intentionally formed in a sequence of successive depositions and then removed by etching. Their method primarily addresses trench filling using less costly atmospheric pressure chemical vapor deposition (APCVD), using ozone and TEOS as the reactive gases. Yao et al. (U.S. Pat. No. 6,048,775) teach a method for planarizing a non-conformally deposited HDPCVD oxide trench fill that is deposited over a pad oxide and a nitride layer. The oxide is deposited at a deposition to sputter ratio (D/S ratio) between 2.5:1 and 7:1. The method so taught is primarily concerned with the planarization of trench fills, particularly the elimination of "dishing" problems associated with chemical mechanical polishing. Lin (U.S. Pat. No. 5,920,792) teaches a method for depositing and planarizing dual HDP-CVD layers on integrated microelectronsics circuits. The layers are deposited using combined deposition and etch processes wherein the etching gas component is argon and the deposition component gas is silane. The HDP-CVD layers taught by Lin also provide a superior trench filling capability. Narwankar et al. (U.S. Pat. No. 6,200,911 B1) teaches a method for modifying the profile of narrow, high aspect ratio gaps on a semiconductor substrate so as to allow their filling in a void-free manner. The method taught by Narwankar involves differential heating of the top and bottom surfaces of the substrate, using an argon plasma for preheating purposes and by carefully controlling top and side coil plasma chamber power. Silane and argon were the gases utilized in this process. Papasouliotis et al (U.S. Pat. No. 6,030,881) teach a method for filling high aspect ratio gaps (>5:1) without the formation of voids. Specifically, the method encompasses a sequence of HDP deposition and etch steps having varying etch-to-deposition rate ratios, wherein the first step uses a rapid deposition in a gas mixture comprising oxygen, silane and argon or helium (an inert gas). This deposition is halted before voids are formed, following which there is applied a step with a more rapid etch rate so as to open up the entry to the partially filled trench. Thereupon, a sequence of deposition and etch steps are applied until the aspect ratio of the increasingly filled trench is low enough to allow a complete fill with a deposition step.

The method of Papasouliotis et al. is not directed at stepped-profile trench openings on substrates in which an upper nitride layer is pulled back from a lower gate oxide layer to reduce the gate oxide thinning. Such stepped-profile openings, while advantageous, present considerable problems in trench filling as the step exacerbates the formation of overhangs. In addition, the method of Papasouliotis et al teaches the use of an inert gas in the initial deposition step, whereas the present inventors have determined that the use of such a gas in the initial step will create nitride damage and enhance void formation by the process of redeposition. Further, the present invention uses a first process step in which there is a high deposition to sputtering ratio and a second step in which there is a low deposition to sputtering ratio, unlike the method taught by Papasouliotis, in which the first and second depositions are the same. It is in an effort to address the void formation problems associated with stepped-profile trench openings and redeposition as well as to reduce the damage to the nitride layer caused by the etching process that the present invention is directed.

SUMMARY OF THE INVENTION

A first object of this invention is to provide a method for filling trenches in integrated circuits.

A second object of the present invention is to provide a method for filling trenches having a high aspect ratio without the resulting formation of voids within the filling material.

A third object of the present invention is to provide a method for filling high aspect ratio trenches having a stepped cross-sectional profile such as would be caused by the formation of said trenches in a substrate on which a nitride layer overlays an underlying oxide layer and wherein said nitride layer has been pulled back from the oxide layer at the trench opening.

A fourth object of the present invention is to provide a method for filling such high aspect ratio trenches in a substrate covered by an oxide and a nitride layer in a manner that avoids a redeposition effect and eliminates damage to the nitride layer, said damage causing problems for endpoint detection during the subsequent chemical mechanical polishing.

In accord with the objects of this invention there is provided a method for filling high aspect ratio trenches, and particularly such trenches formed in substrates in which a nitride layer overlays an oxide layer and is pulled pack from said oxide layer to form a stepped profile. Said method uses a multi-step high density plasma (HDP) deposition process wherein the initial step employs a high (>10) deposition to sputtering (D/S) ratio, allowing the formation of a thin initial oxide layer on the sidewalls of the trench and wherein said initial step also uses low bias power (<1000 W), thereby eliminating nitride damage and re-deposition. Such a thin initial oxide layer eliminates or reduces the shadowing effect of the overhang caused by the covering of the stepped profile of the trench opening, while still protecting the integrity of the nitride layer. A subsequent in-situ sputtering step uses only oxygen as the sputtering gas and is carried out at a D/S ratio of approximately 4.1. This step is critical in maintaining a wide throat opening of the trench. Subsequent steps of the HDP process utilize lower D/S ratios so as to maintain the wide trench opening made possible by the initial deposition step and subsequent sputtering and continues the desired void-free filling. The final deposition is a low D/S ratio HDP step (or sequence of such steps) to preserve the throughput and void-free filling.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein:

FIG. 1 is a schematic cross-sectional diagram of a trench formed in an oxide and nitride covered substrate. The stepped profile resulting from nitride pull-back is shown.

FIG. 2 (prior art) is a schematic representation (for pictorial clarity) of a photomicrograph showing HDP re-deposition effect (directional re-deposition into the trench of material already deposited, caused by impinging sputtering ions) and nitride pull-back shadowing (thickening of the deposition below the step caused by the pull-back) in the first step of a prior art fill process.

FIG. 3 (prior art) is a schematic representation (for pictorial clarity) of a photomicrograph showing severe nitride damage and void formation in a later step of a prior art process.

FIG. 4 is a schematic representation (for pictorial clarity) of a photomicrograph illustrating the first deposition step of the present invention, showing the reduced nitride damage, reduced step overhang and wide trench opening.

DESCRIPTION OF THE PREFERRED EMBODIMENT

Figure 5:
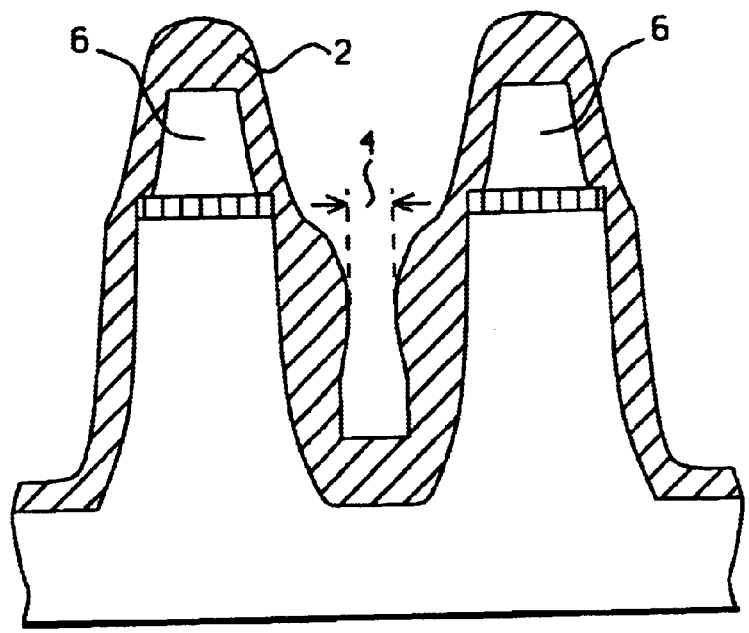
FIG. 5 is a schematic representation (for pictorial clarity) of a photomicrograph illustrating a subsequent deposition step of the present invention and showing the continued reduced nitride damage, reduced step overhang and wide trench opening.

The preferred embodiment of the present invention provides a method of filling a high aspect ratio, stepped profile trench in a nitride and oxide overlaid substrate, so that no voids are formed in the fill and so that damage to the nitride overlay is reduced or eliminated. It is to be understood that the method is equally advantageous in filling high aspect ratio trenches that do not have stepped profiles.

Referring first to FIG. 1, there is shown a schematic representation of the cross-section of a stepped-profile trench, of the type that is filled with particular effectiveness by the method of the present invention. In this embodiment the trench is formed in a layered substrate, comprising a silicon first layer (10) over which is formed a second layer of silicon oxide of thickness between approximately 50 and 250 angstroms (8) over which is formed a third layer of silicon nitride (6) of thickness between approximately 1000 and 2000 angstroms. The trench opening is bordered by a portion of an overlying nitride layer (6), which is pulled back (5) between 100 and 500 A (angstroms) from the edge of the oxide layer (8) to form a step. The pull-back can be performed either before or after formation of a protective oxide liner. The body of the trench has an outside diameter (11) of approximately 0.2 microns or less and penetrates the substrate (10) with fairly straight sides (12).

Referring next to FIG. 2 (prior art), there is shown a schematic representation of a microphotograph of an early stage in the filling of a stepped-profile trench such as was represented in FIG. 1. This particular fill layer resulted from the use of a deposition to sputter (D/S) ratio of 4.5, not in accord with the present invention, but a ratio that would be fairly typical of the prior art. Significant re-deposition produced overhang (2) caused by the step (3) and by the use of heavy ion species such as argon (Ar) in the sputtering can already be seen producing a restricted throat region (4). It is to be noted that heavy ion sputtering species can produce disadvantageous overhangs even in the absence of a stepped profile, but merely as a result of the high aspect ratio of the trench. The nitride layer (6) is shown, already exhibiting damage (rounded top). The oxide layer (8) is also shown. The restricted throat region (4) will prevent effective sputtering in later stages of the filling process and will lead to void formation.

Referring next to FIG. 3 (prior art), there is depicted a schematic representation (for pictorial clarity) of a photomicrograph showing severe nitride damage (2) and void formation (4). The details in this figure represent the final stages of the prior art fill process whose beginning was shown in FIG. 2. The nitride damage makes endpoint detection in subsequent HDP chemical mechanical polishing more difficult.

Referring next to FIG. 4, there is shown a schematic representation (for pictorial clarity) of a photomicrograph illustrating the first fill layer deposited in accord with the method of the present invention. The deposition to sputter ratio is >10 in this case. The sputtering gas is only $O_2$. The $O_2$ also serves as a reactant gas, reacting with $SiH_4$ to produce the $SiO_2$ which is the material forming the fill layer. The sputtering is carried out at low bias power (<1000 W) to avoid damage to the nitride layer (SiN) (6) and to avoid re-deposition. The deposition time is approximately the same as that in FIG. 2, approximately 12.5 seconds. It must be recognized, however, that the time required to achieve the desired degree of fill depends on the geometry of the trench and times between approximately 7 and 15 seconds have been required for trenches of these approximate geometries. The advantages of the present invention can already be seen, however, in that the sidewall oxide thickness (1) is much less than that in FIG. 2, there is a significant reduction in the overhang (2), the throat width is substantially greater (4), re-deposition is absent and damage to the nitride layer (6) is minimal. Even though the oxide thickness is significantly reduced compared to the prior art process of FIG. 2, it is sufficient to prevent nitride damage.

Referring next to FIG. 5, there is shown a schematic representation (for pictorial clarity) of a photomicrograph illustrating the results of the subsequent in-situ sputtering step of the present invention. In this figure, the sputtering has been carried out using a D/S ratio of approximately 4.1 but which can be between approximately 3.5 and 4.5, along with higher bias power of approximately 3000 W. In this sputtering step, only $O_2$ is used as a sputtering gas, to reduce re-deposition and thereby minimize the overhang (2), to form an adequate trench opening (4) for the remaining process of deposition and sputtering and to maintain the low level of nitride (6) and silicon damage. The process time for this portion of the fill deposition is approximately 15 seconds, it again being noted that the time may vary in accord with the trench dimensions.

Figure 6:
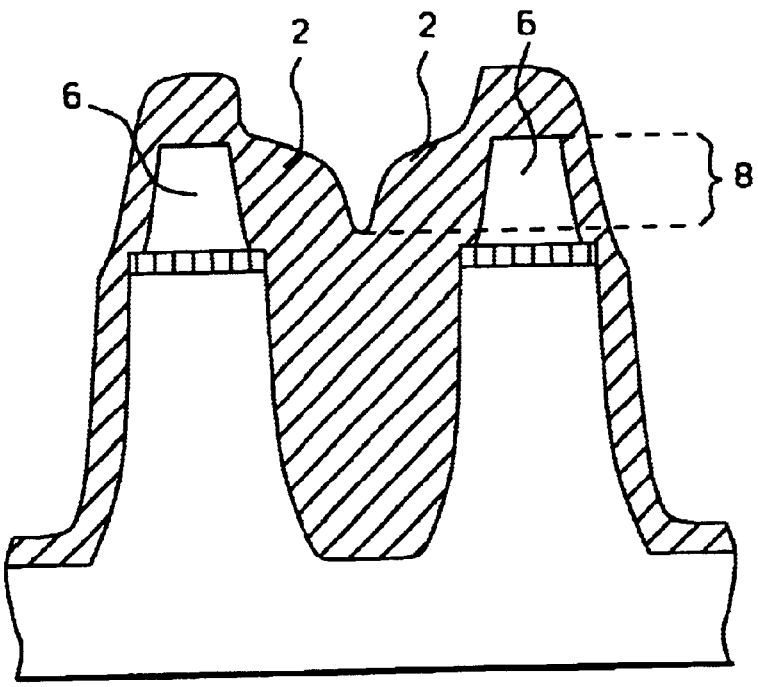
FIG. 6 is a schematic representation (for pictorial clarity) of a photomicrograph illustrating a further deposition step of the present invention and showing the reduced nitride damage and void-free trench fill.

Referring next to FIG. 6, there is shown a schematic representation (for pictorial clarity) of a photomicrograph illustrating a further deposition step of the present invention following the sputtering step illustrated in FIG. 5. In this later deposition step, which is nearly the final step in the sequence of HDP and sputtering steps of the invention, the reduced overhang and shadowing and adequate trench opening already resulting from the initial steps described in FIGS. 4 and 5 now allows the addition of heavy argon (Ar) atoms to the sputtering process to maintain the trench opening (2) by reducing overhang. The overhang reduction and enlarged throat opening enable the argon to effectively enter the region at this step in the process. Further, the use of Ar at this stage of the process can reduce the time required for the process to be completed and thereby increase process throughput. At this point in the process, the D/S ratio is approximately 4.5 but it can be between approximately 4 and 6 and there is higher bias power of approximately 3100 W but it can be in the range between approximately 2500 and 4000 W. If there is a throughput concern and more rapid filling is desired, the D/S ratio can even be increased to 6 at this point. The fill is now essentially complete and the lack of voids and the minimal nitride damage (4) can be seen. The fill is considered to be complete when its upper surface achieves a certain level relative to the surface of the substrate, the present difference between these two levels indicated in the figure as (8) and shows the fill level being below the substrate level. Typically, the fill is complete when its height is between 1.1 and 1.3 times the depth of the trench and, therefore, its level exceeds the substrate surface level by between 0.1 and 0.3 times the depth of the trench.

As is understood by a person skilled in the art, the preferred embodiment of the present invention is illustrative of the present invention rather than limiting of the present invention. Revisions and modifications may be made to methods, materials, structures and dimensions employed in the present method for void free and damage free filling of high aspect ratio stepped-profile trenches in oxide and nitride covered substrates, while still providing a method for void free and damage free filling of high aspect ratio stepped-profile trenches in oxide and nitride covered substrates, in accord with the spirit and scope of the present invention as defined by the appended claims.

What is claimed is:

1. A method for the void-free filling of a trench of high aspect ratio formed in a semiconductor substrate comprising:

providing said substrate;

forming in said substrate a high aspect ratio trench, said trench having an initial opening in the upper surface of said substrate and sidewalls extending into said substrate;

depositing over the exposed sidewalls of said trench an initial layer of filling material, using a first high density plasma (HDP) deposition and sputtering process, said process using only $O_2$ as a first sputtering gas, $O_2$ and $SiH_4$ as first reactant gases, a first ratio of deposition rate to sputtering rate (D/S) that is greater than 10, a first process time and a first bias power that is less than 1000 W;

continuing said sputtering and deposition process of additional filling material on said initial layer using only said first sputtering gas and using said first reactant gases, with a second ratio of deposition rate to sputtering rate (D/S) that is between approximately 3.5 and 4.5, a second process time and a second bias power that is approximately 3000 W;

depositing additional filling material within said trench, in a series of subsequent HDP deposition and sputtering process steps using said first reactant gases, second sputtering gases now including the admixture of Ar, a third ratio of deposition rate to sputtering rate (D/S) between approximately 4 and 6 and a third bias power between approximately 2500 and 4000 W;

terminating said series of subsequent HDP and sputtering process steps when the trench has been filled to a certain height above the upper surface of the substrate.

2. The method of claim 1 wherein the semiconductor substrate is a layered substrate comprising a first layer on which has been successively formed a second layer and a third layer.

3. The method of claim 2 wherein said trench has an opening in said third layer with an initial outside diameter and said trench extends completely through said third layer, completely through said second layer and terminates within said first layer.

4. The method of claim 3 wherein the trench opening in said third layer has been pulled back by a process comprising the removal of an annular region of said third layer surrounding said opening, exposing, thereby, an annular region of the surface of said second layer and creating a cross-sectional stepped profile of said trench, wherein the diameter of the opening in said third layer now exceeds the initial outside diameter of the trench opening to create, thereby, the trench step.

5. The method of claim 4 wherein the first substrate layer is a layer of semiconductor material, the second substrate layer is an oxide layer and the third layer is a nitride layer.

6. The method of claim 5 wherein the semiconductor material is silicon.

7. The method of claim 6 wherein the oxide layer is silicon oxide formed to a thickness of between approximately 50 and 250 angstroms.

8. The method of claim 7 wherein the nitride layer is a layer of silicon nitride formed to a thickness of between approximately 1000 and 2000 angstroms.

9. The method of claim 8 wherein the initial diameter of the trench opening before the pulling back of said silicon nitride layer is not more than approximately 0.2 microns.

10. The method of claim 5 wherein the deposition and sputtering to form said initial layer are carried out with low bias power which is less than approximately 1000 W to avoid damage to the nitride layer.

11. The method of claim 5 wherein the first process time is sufficient to allow the formation of an initial layer that has no overhang on the trench sidewall beneath the trench step and has a sufficient thickness to protect said nitride layer during the subsequent processing.

12. The method of claim 5 wherein the second process time is sufficient to maintain a minimal overhang on the trench sidewall beneath the trench step, to eliminate damage to the nitride layer and to allow the formation of a wide opening in the partially filled trench.

13. The method of claim 1 wherein the height of the fill above the upper surface of the substrate is between approximately 0.1 and 0.3 times the initial depth of the trench.

\* \* \* \* \*